US012666652B2

(12) United States Patent
Oyibo et al.

(10) Patent No.: US 12,666,652 B2
(45) Date of Patent: Jun. 23, 2026

(54) LOCAL BACKSIDE CONTACT ISOLATION FOR MERGED BACKSIDE CONTACT PATTERNING

(71) Applicant: INTERNATIONAL BUSINESS MACHINES CORPORATION, Armonk, NY (US)

(72) Inventors: Gideon Oyibo, Rensselaer, NY (US); Tao Li, Slingerlands, NY (US); Ruilong Xie, Niskayuna, NY (US); Nicolas Jean Loubet, Guilderland, NY (US)

( * ) Notice: Subject to any disclaimer, the term of this patent is extended or adjusted under 35 U.S.C. 154(b) by 439 days.

(21) Appl. No.: 18/532,037

(22) Filed: Dec. 7, 2023

(65) Prior Publication Data

US 2025/0194152 A1 Jun. 12, 2025

(51) Int. Cl.
H01L 29/423 (2006.01)
H01L 29/775 (2006.01)
(Continued)

(52) U.S. Cl.
CPC ....... H10D 30/6735 (2025.01); H10D 30/014 (2025.01); H10D 30/43 (2025.01);
(Continued)

(58) Field of Classification Search
CPC .... H10D 30/014; H10D 30/43; H10D 62/121; H10D 62/151; H10D 62/116;
(Continued)

(56) References Cited

U.S. PATENT DOCUMENTS

| | | | |
|---|---|---|---|
| 9,805,983 | B1 | 10/2017 | Cheng |
| 11,437,283 | B2 | 9/2022 | Lilak |

(Continued)

FOREIGN PATENT DOCUMENTS

| | | | | |
|---|---|---|---|---|
| WO | WO-2023073483 A1 | * | 5/2023 | ............ H10W 20/20 |
| WO | WO-2024245633 A1 | * | 12/2024 | .......... H10W 20/084 |

OTHER PUBLICATIONS

International Searching Authority, "Notification of Transmittal of the International Search Report and the Written Opinion of the International Searching Authority, or Declaration," Patent Cooperation Treaty, Nov. 27, 2024, 10 pages, International Application No. PCT/EP2024/072971.

*Primary Examiner* — Lawrence C Tynes, Jr.

(57) ABSTRACT

A microelectronic structure including a first nanosheet transistor that includes a first source/drain. A second nanosheet transistor that is adjacent to the first nanosheet transistor and the second nanosheet transistor includes a second source/drain. A first backside contact connected to a backside surface of the first source/drain. A second backside contact connected to a backside surface of the second source/drain. A first shallow trench fill layer located between the first backside contact and the second backside contact. A second shallow trench fill layer located adjacent to the first backside contact. The second shallow trench fill layer is located on the opposite side of the first backside contact than the first shallow trench isolation layer. A backside isolation pillar located on top of the first shallow trench isolation fill layer. A top surface of the backside isolation pillar is coplanar with a top surface of the first and second backside contact.

25 Claims, 22 Drawing Sheets

GATE DIRECTION

GATE DIRECTION

TOP DOWN VIEW

(51) Int. Cl.

| | |
|---|---|
| *H01L 29/786* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10D 84/83* | (2025.01) |
| *H10W 10/00* | (2026.01) |
| *H10W 10/17* | (2026.01) |

(52) U.S. Cl.

CPC ....... *H10D 30/6757* (2025.01); *H10D 62/115* (2025.01); *H10D 62/121* (2025.01); *H10D 62/151* (2025.01); *H10D 64/017* (2025.01); *H10D 84/0128* (2025.01); *H10D 84/0149* (2025.01); *H10D 84/0151* (2025.01); *H10D 84/038* (2025.01); *H10D 84/83* (2025.01); *H10W 10/014* (2026.01); *H10W 10/17* (2026.01)

(58) Field of Classification Search

CPC .... H10D 62/115; H10D 62/113; H10D 88/00; H10D 88/01; H10D 88/101; H10D 99/00; H10W 10/014; H10W 10/17

See application file for complete search history.

(56) References Cited

U.S. PATENT DOCUMENTS

| | | | | |
|---|---|---|---|---|
| 11,605,556 | B2 | 3/2023 | Lilak | |
| 11,610,965 | B2 | 3/2023 | Yu | |
| 11,621,197 | B2 | 4/2023 | Su | |
| 11,804,486 | B2 | 10/2023 | Su et al. | |
| 2021/0111115 | A1 | 4/2021 | Morrow | |
| 2021/0134721 | A1 | 5/2021 | Chiang | |
| 2021/0202385 | A1 | 7/2021 | Huang | |
| 2021/0305252 | A1 | 9/2021 | Chiang | |
| 2021/0305381 | A1 | 9/2021 | Chiang | |
| 2021/0351303 | A1 | 11/2021 | Ju | |
| 2021/0376071 | A1 | 12/2021 | Liu | |
| 2021/0376093 | A1 | 12/2021 | Chu | |
| 2022/0392896 | A1 | 12/2022 | Guler | |
| 2023/0197569 | A1 | 6/2023 | Dewey | |
| 2023/0215767 | A1 | 7/2023 | Xie | |
| 2023/0386971 | A1 | 11/2023 | Yu et al. | |
| 2024/0178136 | A1* | 5/2024 | Xie ..................... | H10D 84/0186 |
| 2024/0347423 | A1* | 10/2024 | Mukesh ............. | H10D 30/6757 |
| 2024/0404944 | A1* | 12/2024 | Katakam ........... | H10D 84/0149 |

* cited by examiner

TOP DOWN VIEW

CROSS- SECTION X

CROSS- SECTION Y

CROSS- SECTION X

CROSS- SECTION Y

CROSS- SECTION X

CROSS- SECTION Y

CROSS- SECTION X 130
133
160
115
125

150
150
155
155
160
170
165
175
180

BACKSIDE REGION

FRONTSIDE REGION

CROSS- SECTION Y

120

130

155

150

150

167

157

165

175

180

122

BACKSIDE REGION

FRONTSIDE REGION

CROSS- SECTION X

CROSS- SECTION Y

FIG. 12
CROSS- SECTION X 130
133
160
115
125

150
155
170
160

192
150
155

190
185
165
175
180

FIG. 13
CROSS- SECTION Y

FIG. 14
CROSS- SECTION X

FIG. 15
CROSS- SECTION Y

CROSS- SECTION X

CROSS- SECTION Y

CROSS- SECTION X

FIG. 19
CROSS- SECTION Y

CROSS- SECTION Y

FIG. 21
CROSS- SECTION X

CROSS- SECTION Y

LOCAL BACKSIDE CONTACT ISOLATION FOR MERGED BACKSIDE CONTACT PATTERNING

BACKGROUND

The present invention generally relates to the field of microelectronics, and more particularly to the formation a backside contact.

Nanosheet is the lead device architecture in continuing CMOS scaling. However, nanosheet technology has shown issues when scaling down such that as the devices become smaller and closer together, they are interfering with each other. With the number of devices being fitted in a smaller area it is becoming harder to form separate backside contacts that have enough surface contact with the source/drains.

BRIEF SUMMARY

Additional aspects and/or advantages will be set forth in part in the description which follows and, in part, will be apparent from the description, or may be learned by practice of the invention.

A microelectronic structure including a first nanosheet transistor that includes a first source/drain. A second nanosheet transistor that is adjacent to the first nanosheet transistor and the second nanosheet transistor includes a second source/drain. A first backside contact connected to a backside surface of the first source/drain. A second backside contact connected to a backside surface of the second source/drain. A first shallow trench fill layer located between the first backside contact and the second backside contact. A second shallow trench fill layer located adjacent to the first backside contact. The second shallow trench fill layer is located on the opposite side of the first backside contact than the first shallow trench isolation layer. A backside isolation pillar located on top of the first shallow trench isolation fill layer. A top surface of the backside isolation pillar is coplanar with a top surface of the first and second backside contact.

A microelectronic structure including a first nanosheet transistor that includes a first source/drain. A second nanosheet transistor that is adjacent to the first nanosheet transistor and the second nanosheet transistor includes a second source/drain. A frontside isolation pillar located between the first source/drain and the second source/drain. A first backside contact connected to a backside surface of the first source/drain. A second backside contact connected to a backside surface of the second source/drain. A first shallow trench fill layer located between the first backside contact and the second backside contact. A second shallow trench fill layer located adjacent to the first backside contact. The second shallow trench fill layer is located on the opposite side of the first backside contact than the first shallow trench isolation layer. A backside isolation pillar located on top of the first shallow trench isolation fill layer. The backside isolation pillar is vertically aligned with the frontside isolation pillar along a common axis.

A method including the steps of forming a first nanosheet transistor that includes a first source/drain. Forming a second nanosheet transistor that is adjacent to the first nanosheet transistor and the second nanosheet transistor includes a second source/drain. Forming a first shallow trench fill layer located between on in the backside region between the first source/drain and the second source/drain. Forming a second shallow trench fill layer located on in the backside region space apart from the first shallow trench fill layer. Forming a shared backside a first backside contact connected to a backside surface of the first source/drain and a backside surface of the second source/drain. The formation of the shared backside contact causes a height difference between the first shallow trench fill layer and the second shallow trench fill layer. Separating the shared backside contact into a plurality of backside contacts. Forming a backside isolation pillar located on top of the first shallow trench isolation fill layer. A top surface of the backside isolation pillar is coplanar with a top surface of the first and second backside contact.

BRIEF DESCRIPTION OF THE DRAWINGS

The above and other aspects, features, and advantages of certain exemplary embodiments of the present invention will be more apparent from the following description taken in conjunction with the accompanying drawings, in which:

FIG. 12 illustrates a cross section X of the nanosheet transistor after formation of a first lithography layer and formation of a shared backside contact trench, in accordance with the embodiment of the present invention.

FIG. 13 illustrates a cross section Y of the source/drain region after formation of a first lithography layer and formation of a shared backside contact trench, in accordance with the embodiment of the present invention.

FIG. 14 illustrates a cross section X of the nanosheet transistor after removal of the placeholders and gouging of the source/drains, in accordance with the embodiment of the present invention.

FIG. 15 illustrates a cross section Y of the source/drain region after removal of the placeholders and gouging of the source/drains, in accordance with the embodiment of the present invention.

FIG. 19 illustrates a cross section Y of the source/drain region after formation of a second lithography layer and patterning/etching the shared backside contact, in accordance with the embodiment of the present invention.

FIG. 21 illustrates a cross section X of the nanosheet transistor after increasing the height of the backside interlayer dielectric layer, formation of a plurality of metal lines and formation of a backside-power-distribution-network (BSPDN), in accordance with the embodiment of the present invention.

DETAILED DESCRIPTION

Figure 1:
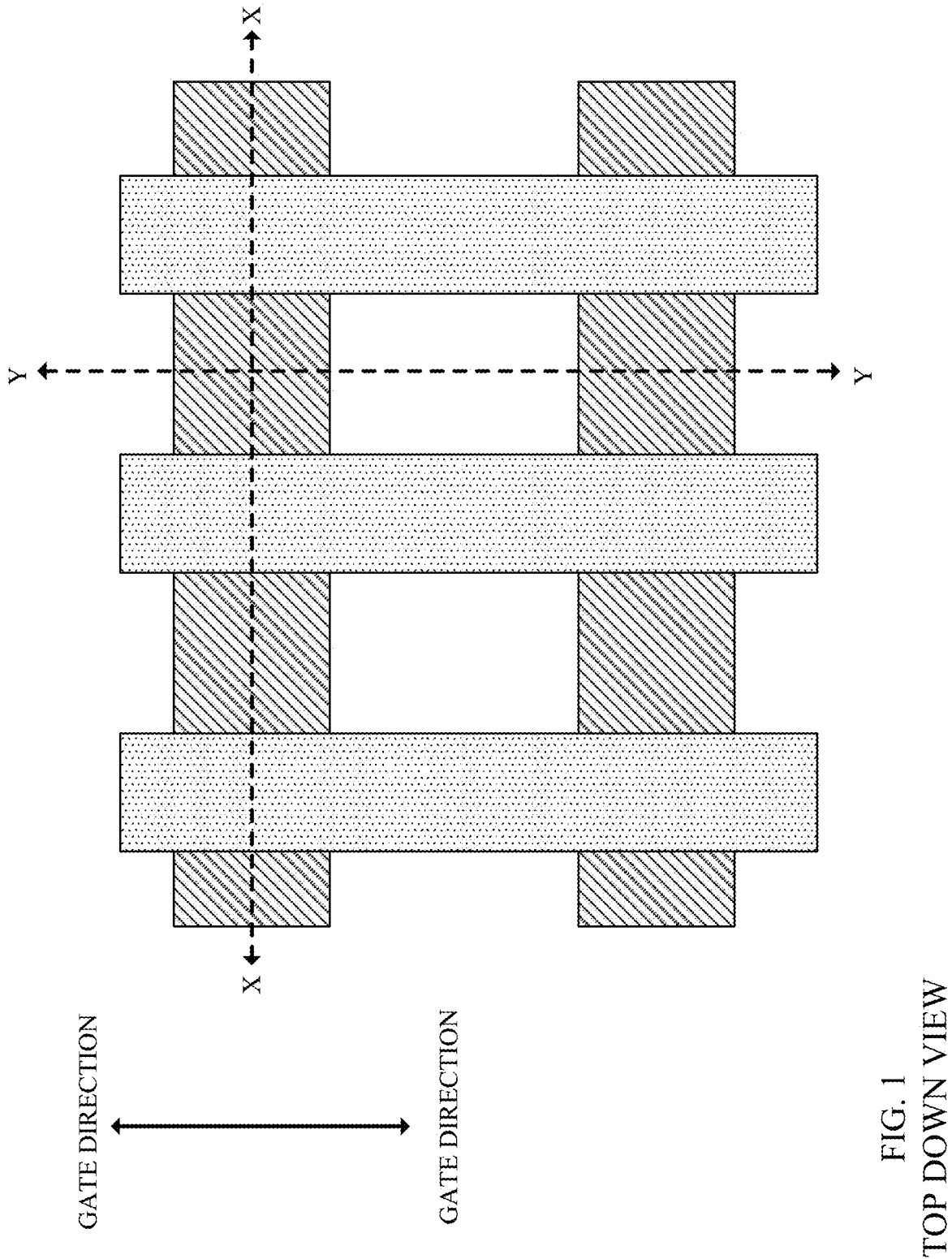
FIG. 1 illustrates a top-down view of a plurality of nanosheet transistors, in accordance with the embodiment of the present invention.

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and the words used in the following description and the claims are not limited to the bibliographical meanings but are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is understood that the singular forms "a," "an," and "the" include plural referents unless the context clearly dictates otherwise. Thus, for example, reference to "a component surface" includes reference to one or more of such surfaces unless the context clearly dictates otherwise.

Detailed embodiments of the claimed structures and the methods are disclosed herein: however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the present embodiments.

References in the specification to "one embodiment," "an embodiment," an example embodiment," etc., indicate that the embodiment described may include a particular feature, structure, or characteristic, but every embodiment may not include the particular feature, structure, or characteristic. Moreover, such phrases are not necessarily referring to the same embodiment. Further, when a particular feature, structure, or characteristic is described in connection with an embodiment, it is submitted that it is within the knowledge of one of ordinary skill in the art o affect such feature, structure, or characteristic in connection with other embodiments whether or not explicitly described.

For purpose of the description hereinafter, the terms "upper," "lower," "right," "left," "vertical," "horizontal," "top," "bottom," and derivatives thereof shall relate to the disclosed structures and methods, as orientated in the drawing figures. The terms "overlying," "atop," "on top," "positioned on," or "positioned atop" mean that a first element, such as a first structure, is present on a second element, such as a second structure, where intervening elements, such as an interface structure may be present between the first element and the second element. The term "direct contact" means that a first element, such as a first structure, and a second element, such as a second structure, are connected without any intermediary conducting, insulating, or semiconductor layer at the interface of the two elements.

In the interest of not obscuring the presentation of embodiments of the present invention, in the following detailed description, some processing steps or operations that are known in the art may have been combined together for presentation and for illustrative purposes and in some instance may have not been described in detail. In other instances, some processing steps or operations that are known in the art may not be described at all. It should be understood that the following description is rather focused on the distinctive features or elements of various embodiments of the present invention.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or indirect coupling, and a positional relationship between entities can be direct or indirect positional relationship. As an example of indirect positional relationship, references in the present description to forming layer "A" over layer "B" includes situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains," or "containing" or any other variation thereof, are intended to cover a non-exclusive inclusion. For example, a composition, a mixture, process, method, article, or apparatus that comprises a list of elements is not necessarily limited to only those elements but can include other element not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiment or designs. The terms "at least one" and "one or more" can be understood to include any integer number greater than or equal to one, i.e., one, two, three, four, etc. The terms "a plurality" can be understood to include any integer number greater than or equal to two, i.e., two, three, four, five, etc. The term "connection" can include both indirect "connection" and a direct "connection."

As used herein, the term "about" modifying the quantity of an ingredient, component, or reactant of the invention employed refers to variation in the numerical quantity that can occur, for example, through typical measuring and liquid handling procedures used for making concentrations or solutions. Furthermore, variation can occur from inadvertent error in measuring procedures, differences in manufacture, source, or purity of the ingredients employed to make the compositions or carry out the methods, and the like. The terms "about" or "substantially" are intended to include the degree of error associated with measurement of the particular quantity based upon the equipment available at the time of the filing of the application. For example, about can include a range of ±8%, or 5%, or 2% of a given value. In another aspect, the term "about" means within 5% of the reported numerical value. In another aspect, the term "about" means within 10, 9, 8, 7, 6, 5, 4, 3, 2, or 1% of the reported numerical value.

Various processes are used to form a micro-chip that will be packaged into an integrated circuit (IC) fall in four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE), and more recently, atomic layer deposition (ALD) among others. Removal/etching is any process that removes material from the wafer. Examples include etching process (either wet or dry), reactive ion etching (RIE), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implant dopants. Films of both conductors (e.g., aluminum, copper, etc.) and insulators (e.g., various forms of silicon dioxide, silicon nitride, etc.) are used to connect and isolate electrical components. Selective doping of various regions of the semiconductor substrate allows the conductivity of the substrate to be changed with the application of voltage.

Reference will now be made in detail to the embodiments of the present invention, examples of which are illustrated in the accompanying drawings, where like reference numerals refer to like elements throughout. The present invention is directed towards the formation of a shared backside source/drain contact that is separated into a plurality of separate contacts. The separate backside contacts are isolated from each other by a backside dielectric pillar. Two adjacent source/drains, i.e., two source/drains that are aligned along a common axis, where the common axis is parallel to the gate direction. The two source/drains are separated from each other by a frontside dielectric pillar. During the backside processing of the nanosheet transistor a shared backside contact is formed, such that the shared backside contact is connected to both source/drains. The shared backside contact is separated into a plurality of backside contacts. A backside isolation pillar is formed between two adjacent backside contacts. During the formation of the shared backside contact and the separation process, the height of a center section of the shallow trench isolation fill layer located between the two adjacent backside contacts is decreased. The backside isolation pillar is in contact with the center section of the shallow trench isolation fill layer. The combined height of the center section of the shallow trench isolation fill layer and the backside isolation pillar is greater than the height of the outside shall trench isolation layer.

FIG. 1 illustrates a top-down view of multiple devices, in accordance with the embodiment of the present invention. The cross-section X extends horizontally through nanosheet transistors. Cross section Y is perpendicular to cross section X, where cross section Y is through a source/drain region that spans across multiple adjacent nanosheet transistors. Cross-section X is perpendicular to the gate direction and cross-section Y is parallel to the gate direction.

Figure 2:
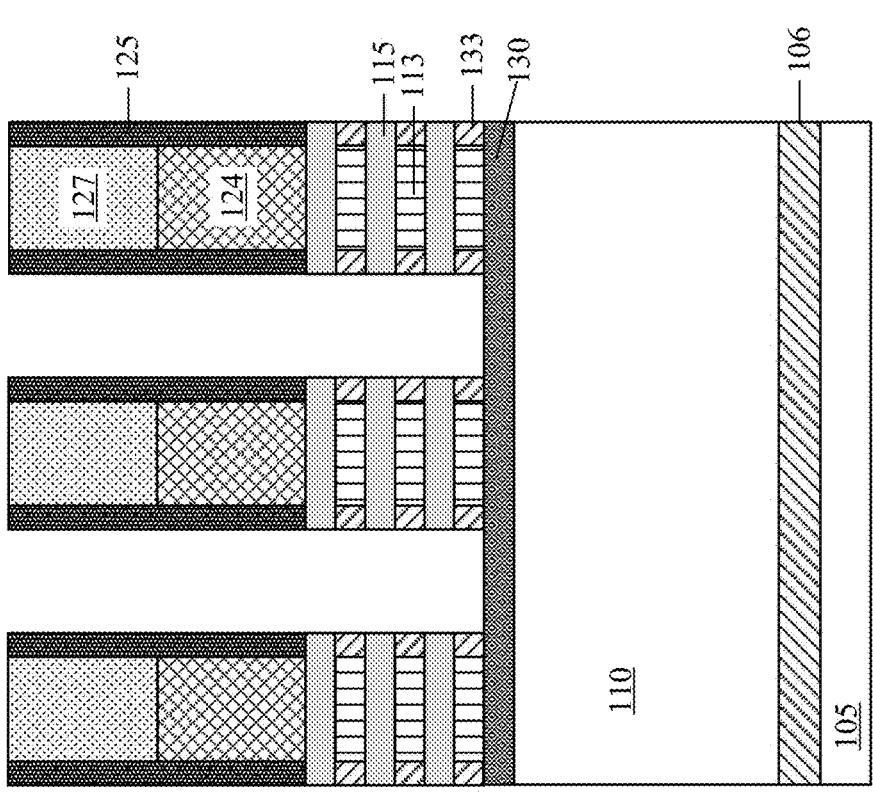
FIG. 2 illustrates a cross section X of the nanosheet transistor after the formation of the source/drain regions and the formation of the inner spacer, in accordance with the embodiment of the present invention.
Figure 3:
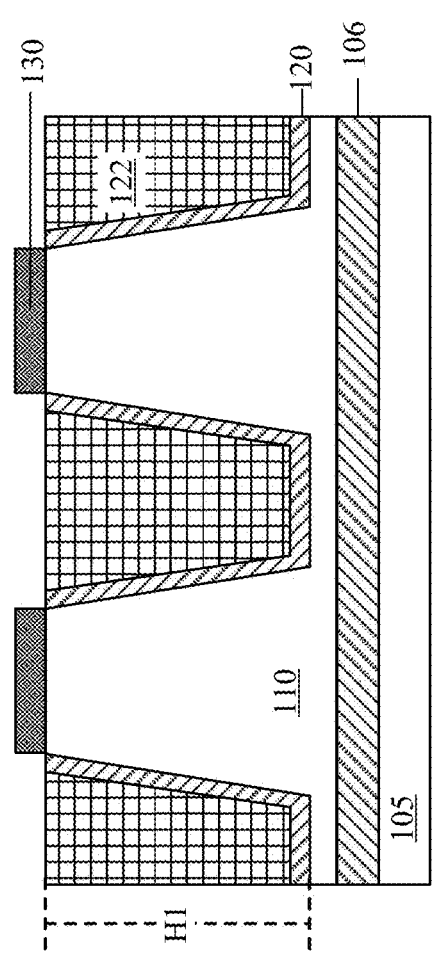
FIG. 3 illustrates a cross section Y of the source/drain region after the formation of the source/drain regions and the formation of the inner spacer, in accordance with the embodiment of the present invention.

Referring now to FIGS. 2 and 3, a structure is shown during an intermediate step of a method of fabricating after the formation of the source/drain regions and the formation of the inner spacer.

FIGS. 2 and 3 illustrate the processing stage after the formation of the source/drain regions and the formation of the inner spacer 133. FIG. 2 illustrates the nano stack of the nanosheet transistors that includes a first substrate 105, an etch stop 106, a second substrate 110, a self-aligned substrate isolation layer 130, a plurality of nanostack (nanosheet) columns, a dummy gate 124, a hardmask 127, gate spacer 125, and inner spacer 133.

Each of the plurality of nanostack (nanosheet columns) includes alternating layers includes channel layers 115, and sacrificial layers 113. The plurality of channel layers 115 can be comprised of, for example, Si. The plurality of sacrificial layers 113 can be comprised of SiGe, where Ge is in the percentage of 15 to 35%. The first substrate 105 and the second substrate 110 can be, for example, a material including, but not necessarily limited to, silicon (Si), silicon germanium (SiGe), Si: C (carbon doped silicon), carbon doped silicon germanium (SiGe: C), III-V, II-V compound semiconductor or another like semiconductor. In addition, multiple layers of the semiconductor materials can be used as the semiconductor material of the first substrate 105 and the second substrate 110. In some embodiments, first substrate 105 and the second substrate 110 includes both semiconductor materials and dielectric materials. The semiconductor first substrate 105 and the second substrate 110 may also comprise an organic semiconductor or a layered semiconductor such as, for example, Si/SiGe, a silicon-on-insulator or a SiGe-on-insulator. A portion or the entire semiconductor first substrate 105 and the second substrate 110 may also be comprised of an amorphous, polycrystalline, or monocrystalline. The semiconductor first substrate 105 and the second substrate 110 may be doped, undoped or contain doped regions and undoped regions therein.

The self-aligned substrate isolation layer 130 extends under each of the nanostack columns and in the source/drain regions as illustrated in FIG. 2. A column of the dummy gate 124, the hardmask 127, and the gate spacer are located on reach of the nanostack columns. The sacrificial layers 113 were recessed to create space for the formation of the inner spacer 133.

FIG. 3 illustrates source/drain regions after the alternating layers (i.e., the channel layers 115 and the sacrificial layers 113) are removed. The etching process that separates the alternating layers into a plurality of rows forms trenches within the second substrate 110. These trenches are filled in with a shallow trench isolation layer. The shallow trench isolation layer includes a shallow trench isolation (STI) liner 120 and a STI fill layer 122. FIG. 3 illustrates three adjacent sections of the STI liner 120 and the STI fill layer 122, that are separated by portions of the second substrate 110. Each of these sections of the shallow trench isolation layer has a height/depth/dimension H1 (e.g., the combined height of the STI liner 120 and the STI fill layer 122) that is substantially equal to each other.

Figure 4:
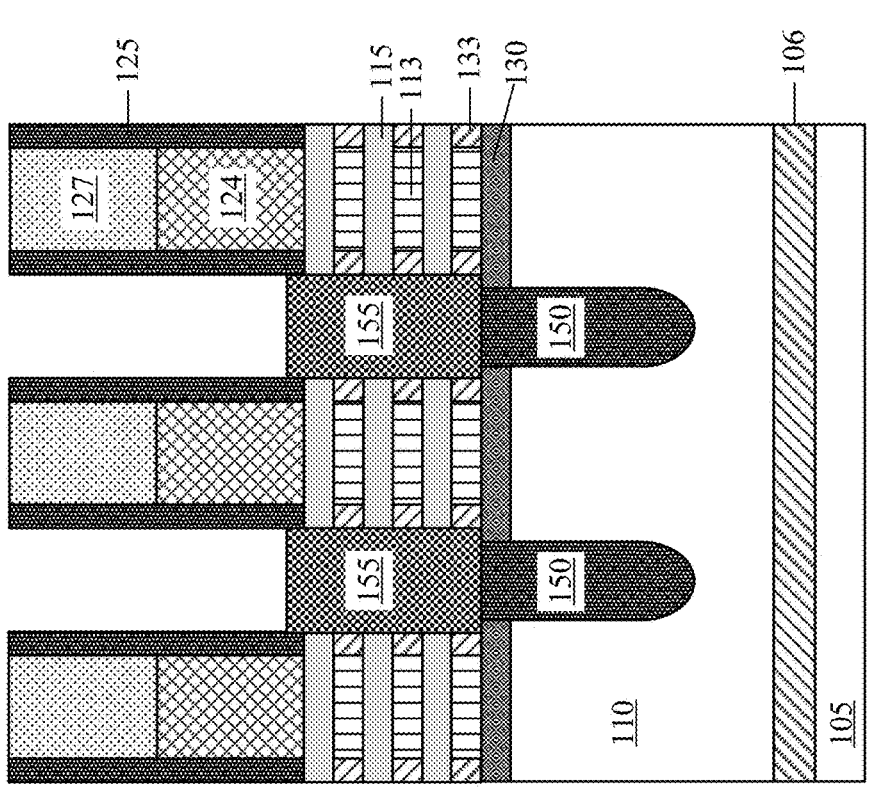
FIG. 4 illustrates a cross section X of the nanosheet transistor after the formation of placeholders and the formation of source/drains, in accordance with the embodiment of the present invention.
Figure 5:
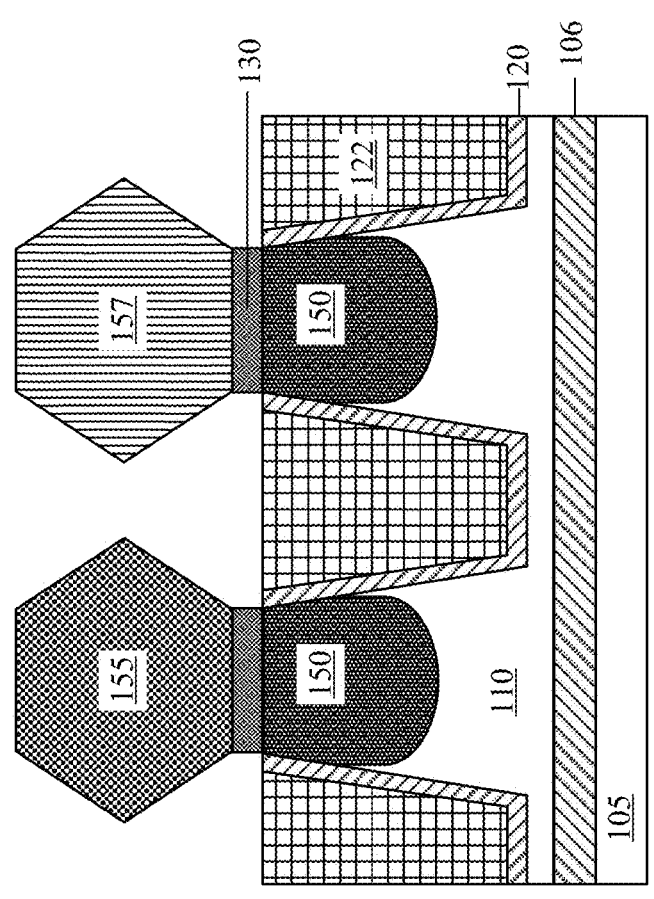
FIG. 5 illustrates a cross section Y of the source/drain region after the formation of placeholders and the formation of source/drains, in accordance with the embodiment of the present invention.

FIGS. 4 and 5 illustrate the processing stage after the formation of placeholders 150 and the formation of source/drains 155, 157. Trenches (not shown) are formed in the source/drain regions and these trenches extend through the self-aligned bottom isolation layer 130 and into the second substrate 110. Placeholders 150 are formed by filling these trenches with a suitable sacrificial material. Source/drains 155, 157 are epitaxially grown on top of the placeholders 150 in the source/drain regions, such that a source/drain 155, 157 is located between two adjacent nanostack columns. Source/drains 155 and 157 are aligned along a common axis, where the common axis is parallel to the gate direction.

The source/drains 155, 157 can be for example, a n-type epitaxy, or a p-type epitaxy. For n-type epitaxy, an n-type dopant selected from a group of phosphorus (P), arsenic (As) and/or antimony (Sb) can be used. For p-type epitaxy, a p-type dopant selected from a group of boron (B), gallium (Ga), indium (In), and/or thallium (Tl) can be used. Other doping techniques such as ion implantation, gas phase doping, plasma doping, plasma immersion ion implantation, cluster doping, infusion doping, liquid phase doping, solid phase doping, and/or any suitable combination of those techniques can be used. In some embodiments, dopants are activated by thermal annealing such as laser annealing, flash annealing, rapid thermal annealing (RTA) or any suitable combination of those techniques.

Figure 6:
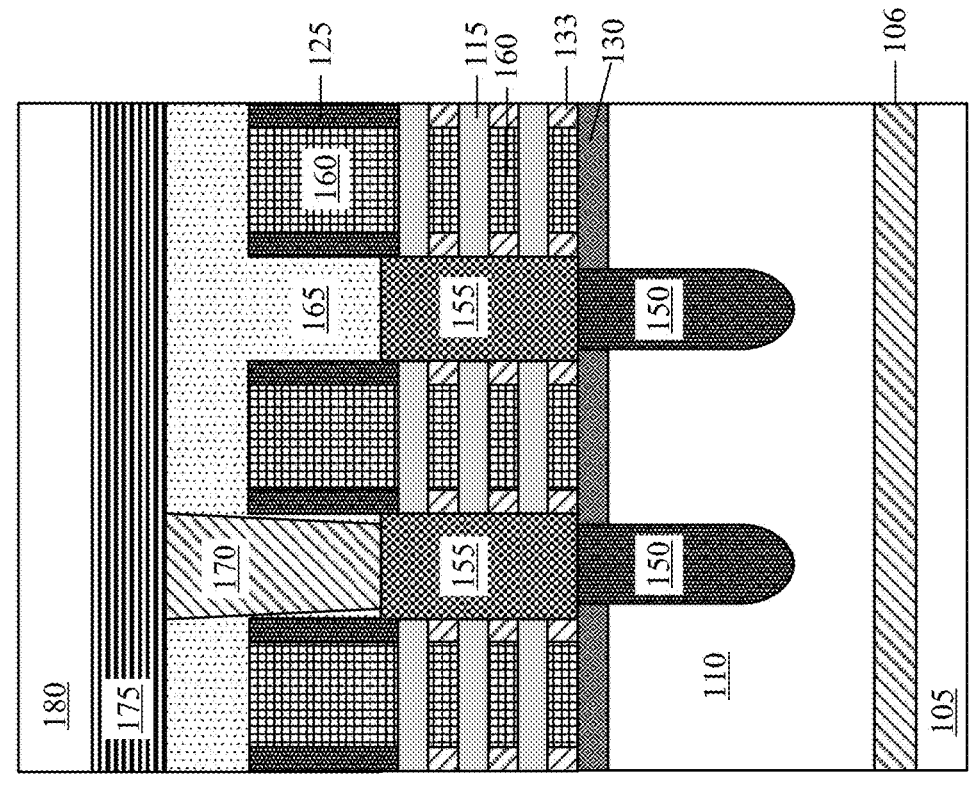
FIG. 6 illustrates a cross section X of the nanosheet transistor after the formation of frontside interlayer dielectric layer, removal of the hardmask, dummy gate, and the sacrificial layer, formation of the gate, formation of the frontside dielectric pillar, formation of additional frontside interlayer dielectric material, formation of frontside contact, formation of the back-end-of-the-line (BEOL) layer, and the formation of the carrier wafer, in accordance with the embodiment of the present invention.
Figure 7:
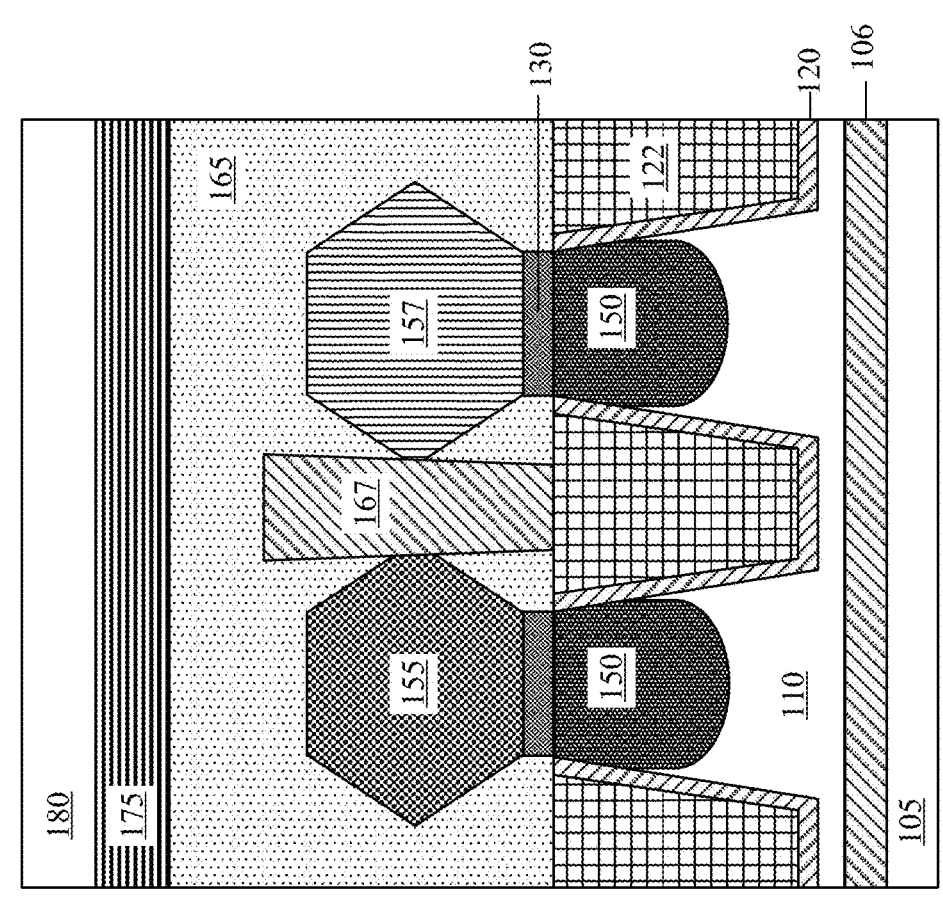
FIG. 7 illustrates a cross section Y of the source/drain region after the formation of frontside interlayer dielectric layer, removal of the hardmask, dummy gate, and the sacrificial layer, formation of the gate, formation of the frontside dielectric pillar, formation of additional frontside interlayer dielectric material, formation of frontside contact, formation of the back-end-of-the-line (BEOL) layer, and the formation of the carrier wafer, in accordance with the embodiment of the present invention.

FIGS. 6 and 7 illustrate the processing stage after the formation of frontside interlayer dielectric layer 165, removal of the hardmask 127, dummy gate 124, and the sacrificial layers 113, formation of the gate 160, formation of the frontside dielectric pillar 167, formation of additional frontside interlayer dielectric material 165, formation of frontside contact 170, formation of the back-end-of-the-line (BEOL) layer 175, and the formation of the carrier wafer 180.

A frontside interlayer dielectric layer 165 is formed on top of and around the source/drains 155, 157. The hardmask 127, dummy gate 124, and the sacrificial layer 113 are removed to create empty space for the formation of gate 160. Gate 160 is formed in this empty space. Gate 160 can be comprised of, for example, a gate dielectric liner, such as high-k dielectric like $HfO_2$, $ZrO_2$, $HfL_aO_x$, etc., and work function layers, such as TIN, TiAlC, TiC, etc., and conductive metal fills, like W. A trench (not shown) is formed in the frontside interlayer dielectric layer 165, where the trench is located between the adjacent but parallel rows of nano transistors. The trench is further located between adjacent source/drains 155, 157. The trench can extend along the length of the nanosheet transistors, can extend along portions of the length, the trench can be located at specific locations, multiple trenches can be formed, or a combination of trenches can be utilized. Frontside dielectric pillar 167 is formed by filling the trench in with a dielectric material as illustrated in FIG. 7. Frontside dielectric pillar 167 isolates source/drains 155, 157 from each other. Frontside dielectric pillar 167 can be in contact with the source/drains 155, 157 as illustrated in FIG. 7, or portions of the frontside interlayer dielectric layer 165 can be located between the frontside dielectric pillar 167 and each of the source/drains 155, 157. Additional frontside interlayer dielectric layer 165 material is added to increase the height of the layer so that it extends over gate 160 and over the frontside dielectric pillar 167.

Trenches (not shown) are formed in the frontside interlayer dielectric layer 165 and filled with a conductive metal to form frontside contact 170 as illustrated in FIG. 6. FIG. 6 illustrates only one frontside contact 170 but the logic device can have more than one frontside contact 170. Back-end-of-the-line (BEOL) layer 175 is formed on top of the frontside interlayer dielectric layer 165 and on top of the frontside contact 170. A carrier wafer 180 is formed on top of the BEOL layer 175.

Figure 8:
FIG. 8 illustrates a cross section X of the nanosheet transistor after flipping the nano transistor over for backside processing and removal of the first substrate, the etch stop, and the second substrate, in accordance with the embodiment of the present invention.
Figure 9:
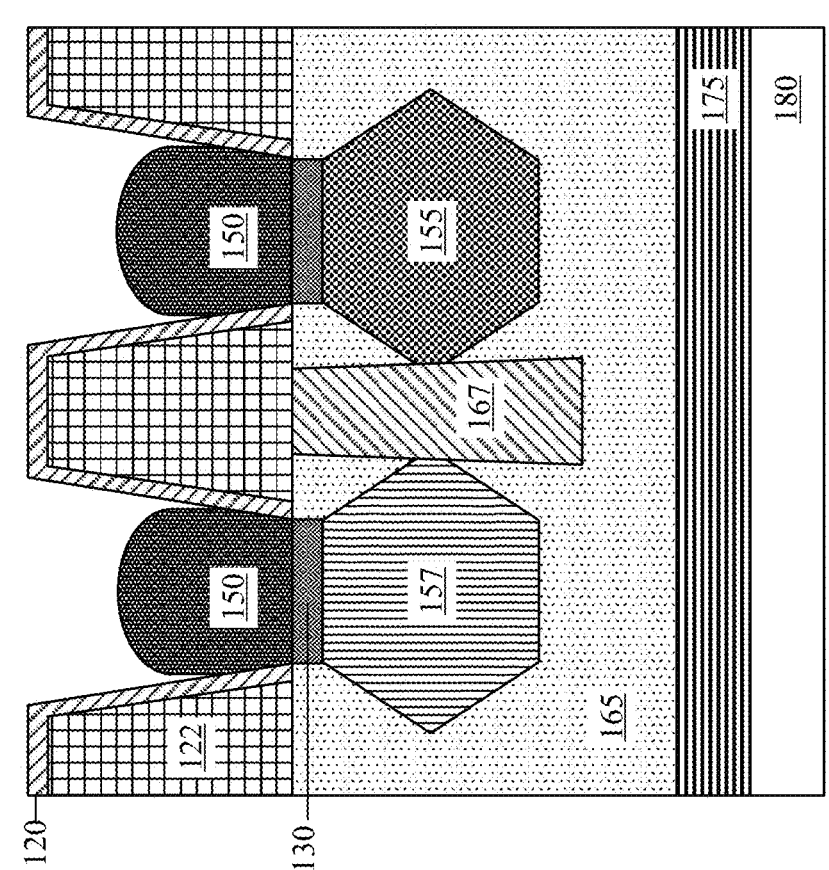
FIG. 9 illustrates a cross section Y of the source/drain region after flipping the nano transistor over for backside processing and removal of the first substrate, the etch stop, and the second substrate, in accordance with the embodiment of the present invention.
Figure 9:
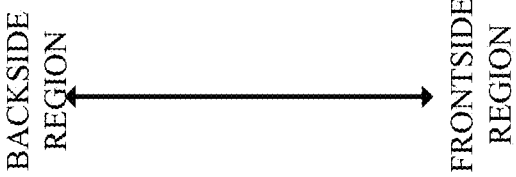

FIGS. 8 and 9 illustrate the processing stage after flipping the nano transistor over for backside processing and removal of the first substrate 105, the etch stop 106, and the second substrate 110. Carrier wafer 180 allows for the nanosheet transistor (logic device, or logic device with a passive device) to be flipped over for backside processing, i.e., flipping over the nanosheet transistor exposes the backside region of the device. The first substrate 105, the etch stop 106, and the second substrate 110 are removed. The removal of these layers exposes the backside surface of the self-aligned substrate isolation layer 130, the placeholders 150, and portions of the STI liner 120.

Figure 10:
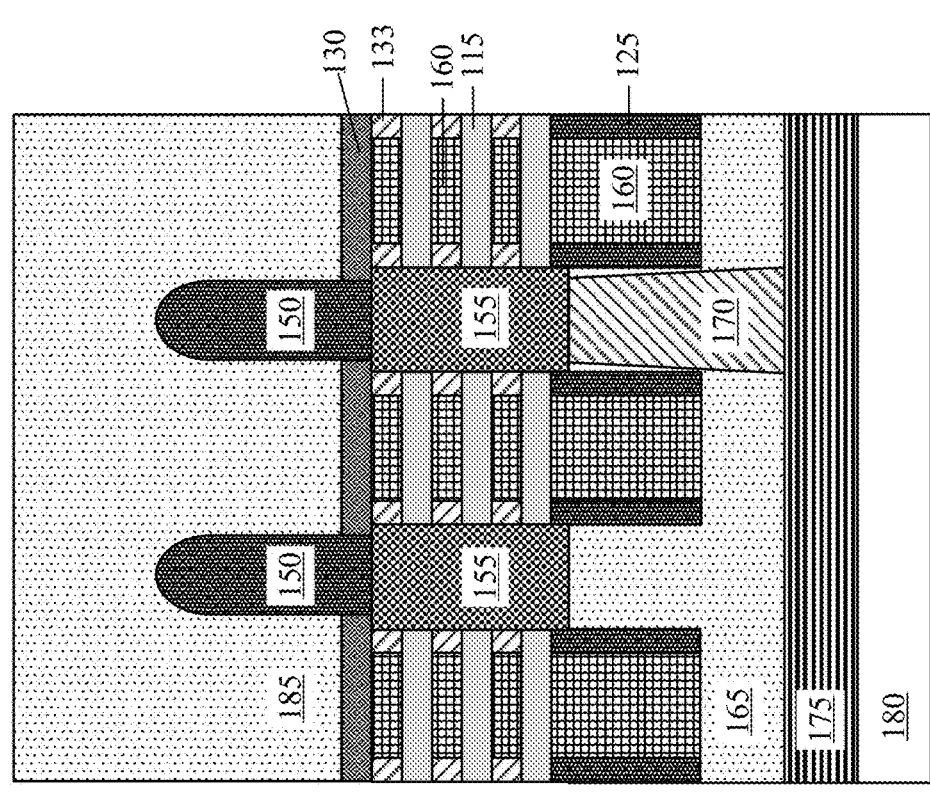
FIG. 10 illustrates a cross section X of the nanosheet transistor after formation of the backside interlayer dielectric layer, in accordance with the embodiment of the present invention.
Figure 11:
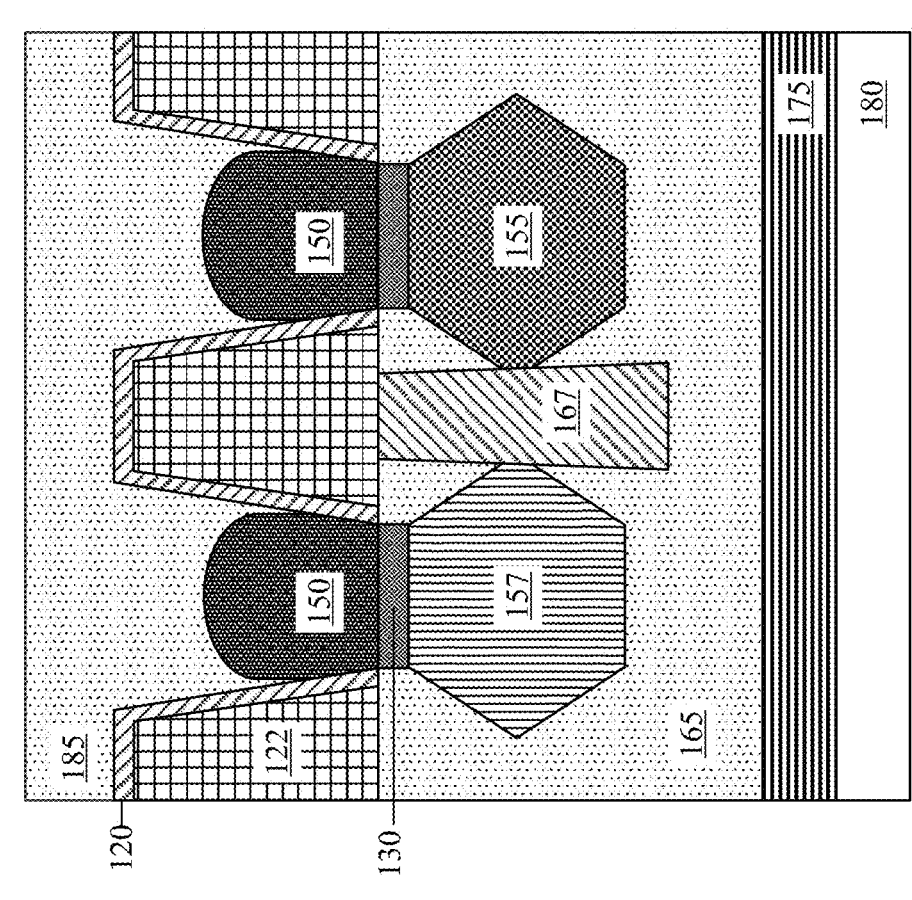
FIG. 11 illustrates a cross section Y of the source/drain region after formation of the backside interlayer dielectric layer, in accordance with the embodiment of the present invention.

FIGS. 10 and 11 illustrate the processing stage after formation of the backside interlayer dielectric layer 185. A backside interlayer dielectric layer 185 is formed on the exposed surfaces, such that the backside interlayer dielectric layer 185 encloses the exposed placeholders 150, as illustrated in FIGS. 10 and 11. The backside interlayer dielectric layer 185 is also formed on top of the STI liner 120. The STI liner 120 and the backside interlayer dielectric layer 185 are comprised of different materials.

Figure 12:
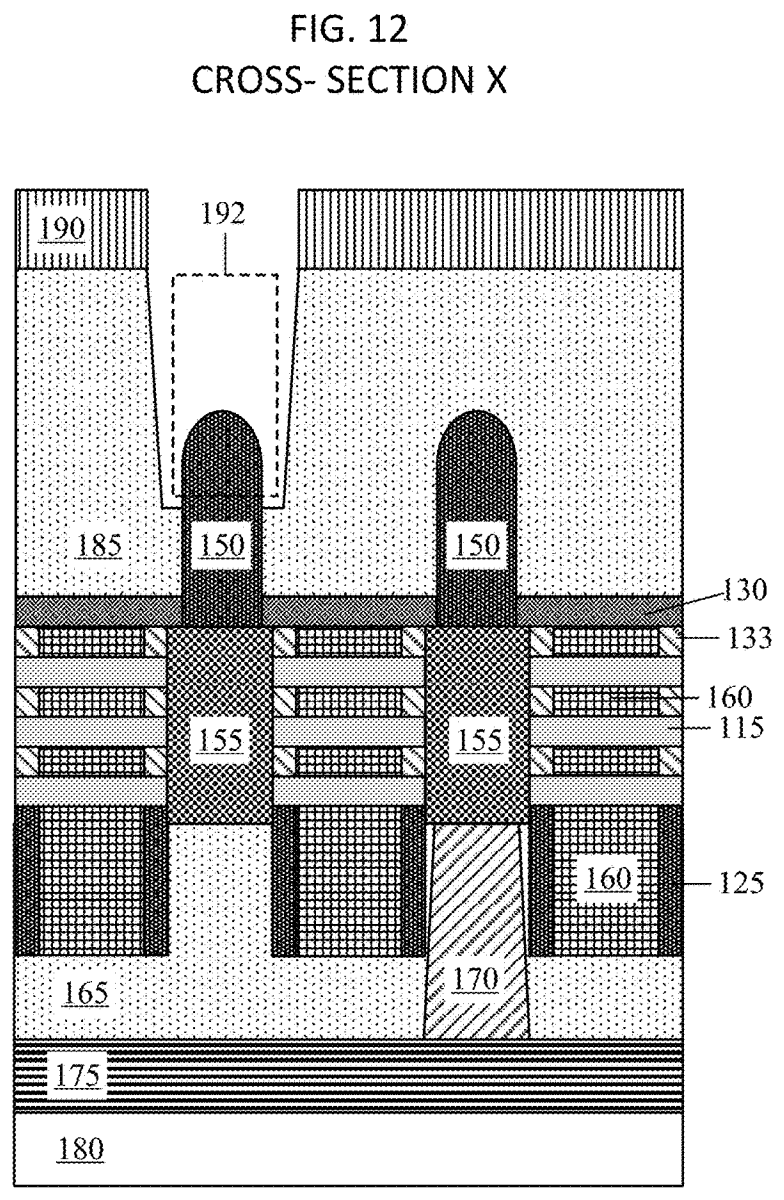
Figure 13:
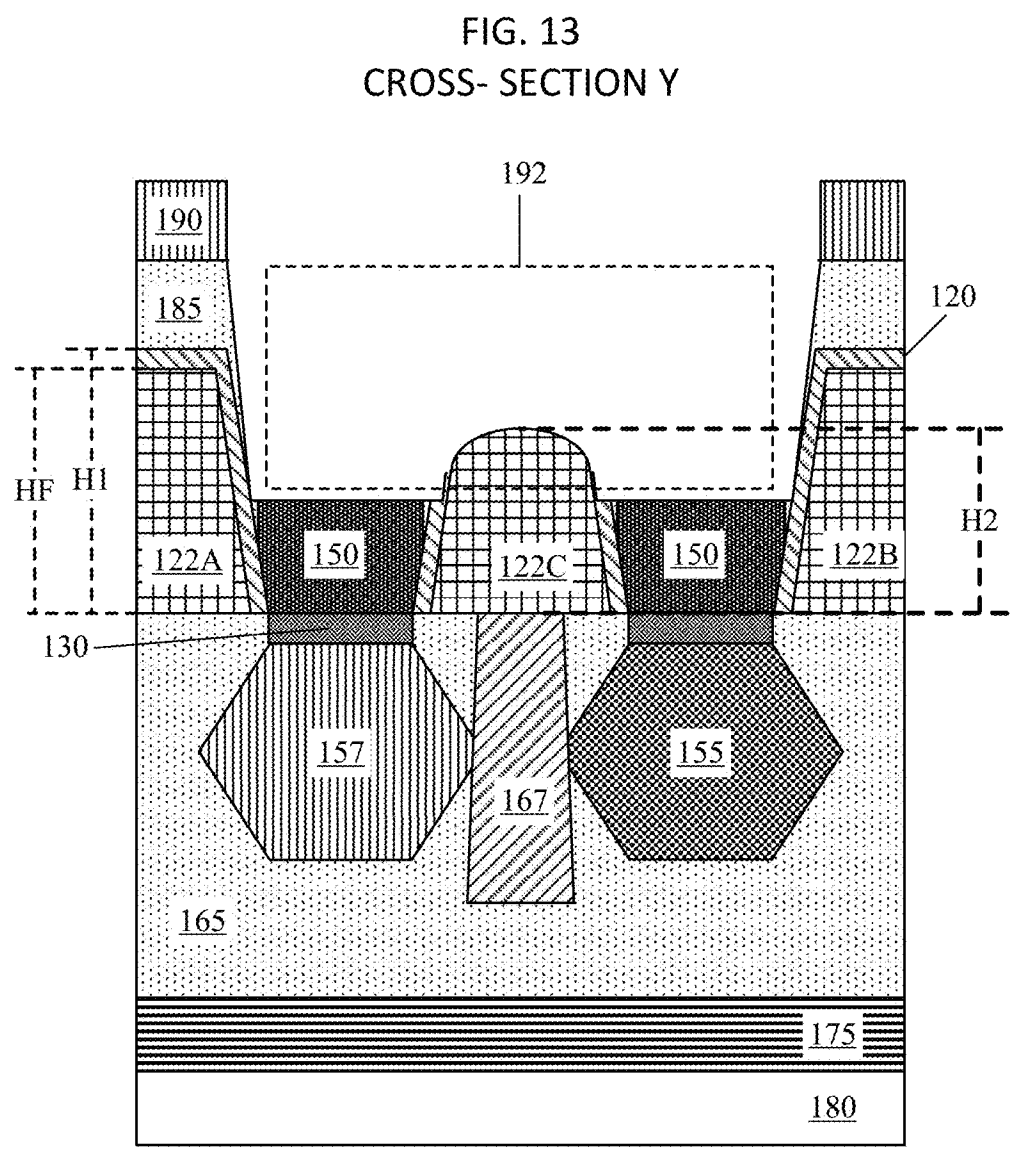

FIGS. 12 and 13 illustrate the processing stage after formation of a first lithography layer 190 and formation of a shared backside contact trench 192. First lithography layer 190 is formed on top of the backside interlayer dielectric layer 185. The first lithography layer 190 and the backside interlayer dielectric layer 185 are patterned to form the shared backside contact trench 192. As illustrated in FIG. 13, the shared backside contact trench 192 extends between two placeholders 150. Forming the backside contact trench 192 also removes a portion of the STI liner 120 and a portion of the STI fill layer 122 sandwiched between two adjacent placeholders 150. The center STI fill layer 122 will now be referred to as STI fill layer 122C. The STI fill layers 122 (i.e., the sections not damaged during the formation of the shared backside contact trench 192) located on the opposite sides of the placeholders 150 will now be referred to STI fill layer 122A and 122B. STI fill layer 122A or 122B and the STI liner 120 have a combined height of H1. STI liner 120 has been removed from the top surface of the STI fill layer 122C (by the etching process), such that the STI liner 120 is only located on the sides of the STI fill layer 122C. The etching/patterning of the backside shared contact trench 192 reduces the height of the STI fill layer 122C. Height H2 represents the height of the STI fill layer 122C, such that height H1 is larger than height H2. Furthermore, the height HF of the STI fill layer 122A or 122B is greater than the height H2 of STI fill layer 122C as illustrated in FIG. 13.

Figure 14:
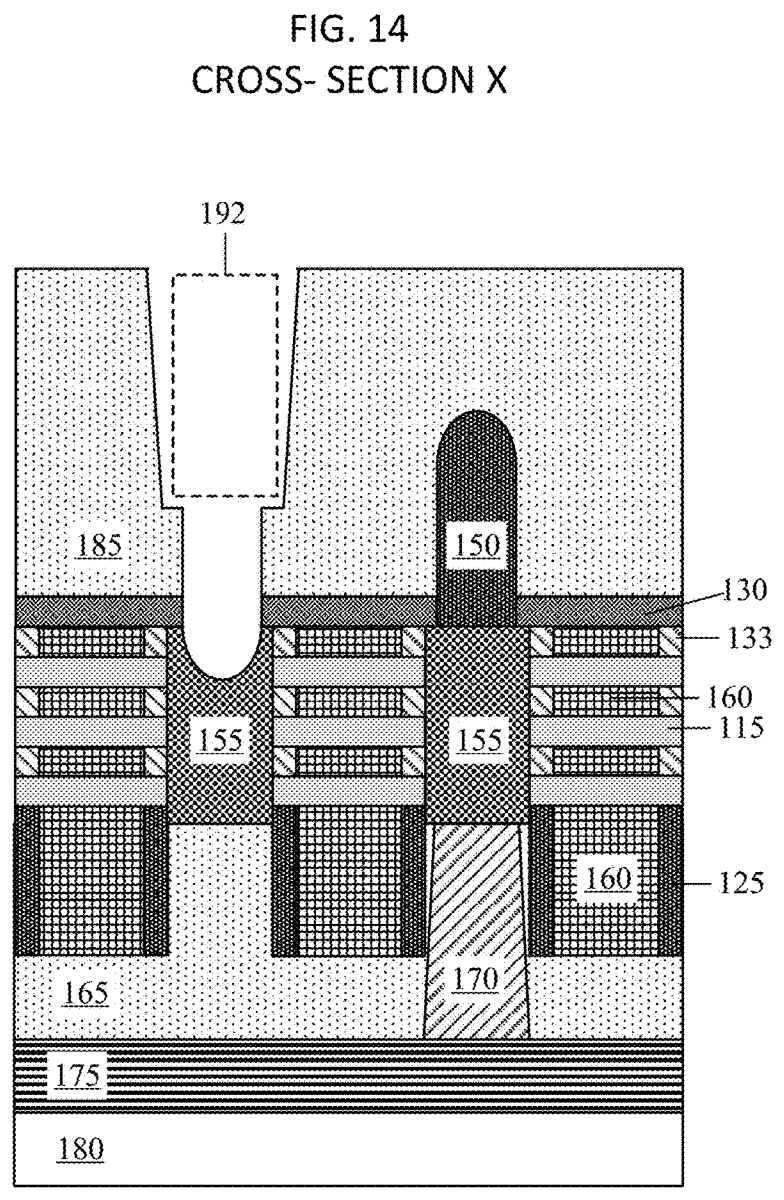
Figure 15:
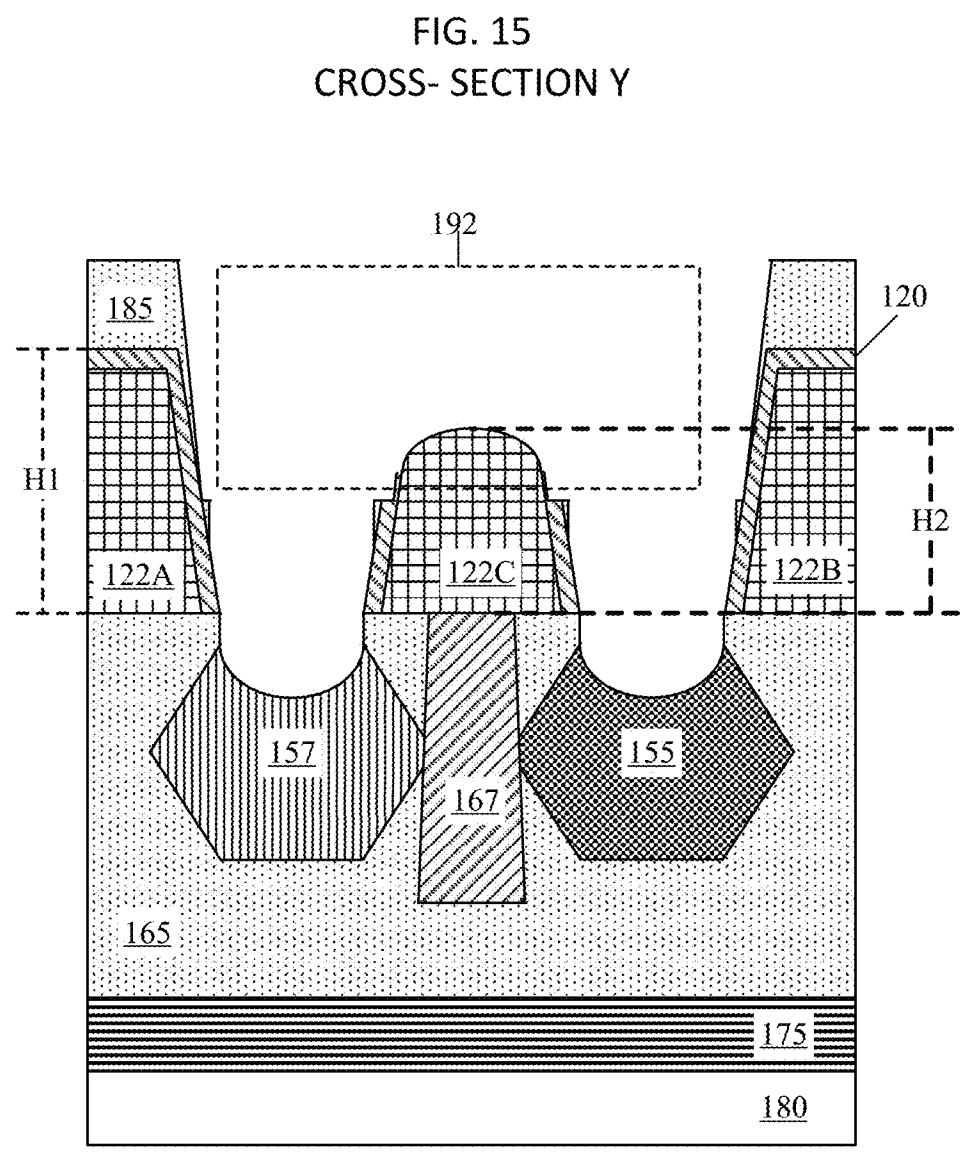

FIGS. 14 and 15 illustrate the processing stage after removal of the placeholders 150 and gouging of the source/drains 155, 157. Placeholder 150 are removed to expose the backside surface of the source/drains 155, 157. An optional gouging process can be utilized to remove a portion of each of the source/drain 155, 157. The optional gouging process increases the amount of the exposed surface area of the source/drains 155, 157.

Figure 16:
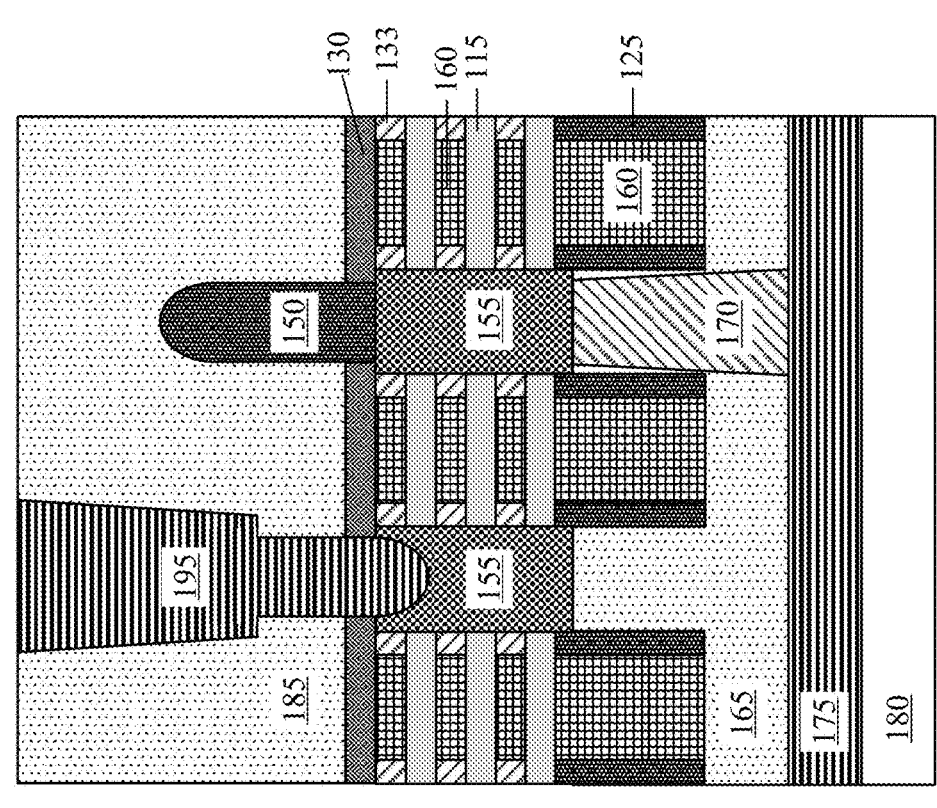
FIG. 16 illustrates a cross section X of the nanosheet transistor after formation of the shared backside contact, in accordance with the embodiment of the present invention.
Figure 17:
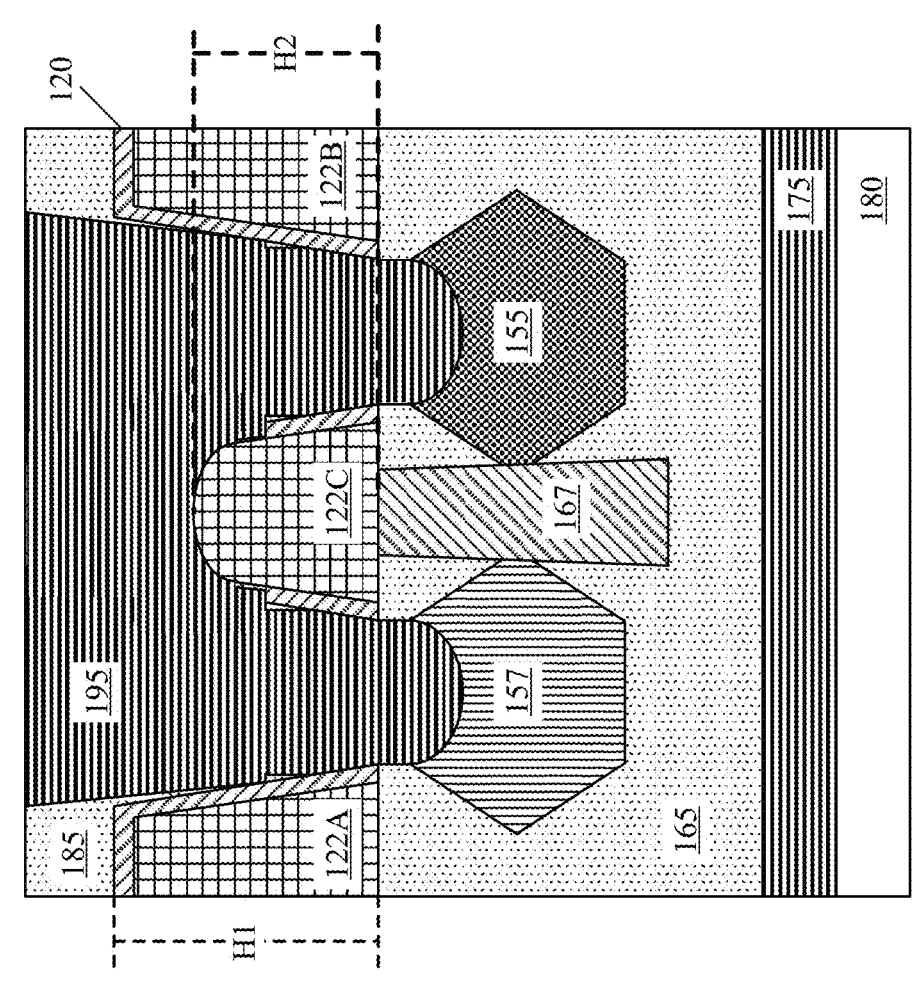
FIG. 17 illustrates a cross section Y of the source/drain region after formation of the shared backside contact, in accordance with the embodiment of the present invention.

FIGS. 16 and 17 illustrate the processing stage after formation of the shared backside contact 195. A metallization process is utilized to fill the shared backside contact trench 192 with a conductive metal to form the shared backside contact 195. The shared backside contact 195 is in direct contact with the backside surface of two adjacent source/drains 155, 157. The shared backside contact 195 extends higher than the shallow trench isolation layer (e.g., the combined height H1 of the STI liner 120 and the STI fill layer 122A or 122B).

Typically, a planarization process is used to reduce the height of the shared backside contact 195 but the planarization process causes issues with any accompanying passive device (not shown) located adjacent or near to the nanosheet transistor (logic device). The planarization process will reduce the amount of doped substrate (i.e., doped Si layer) available for the passive device to function. The present invention does not utilize a planarization process to reduce the height of the shared backside contact 195.

Figure 18:
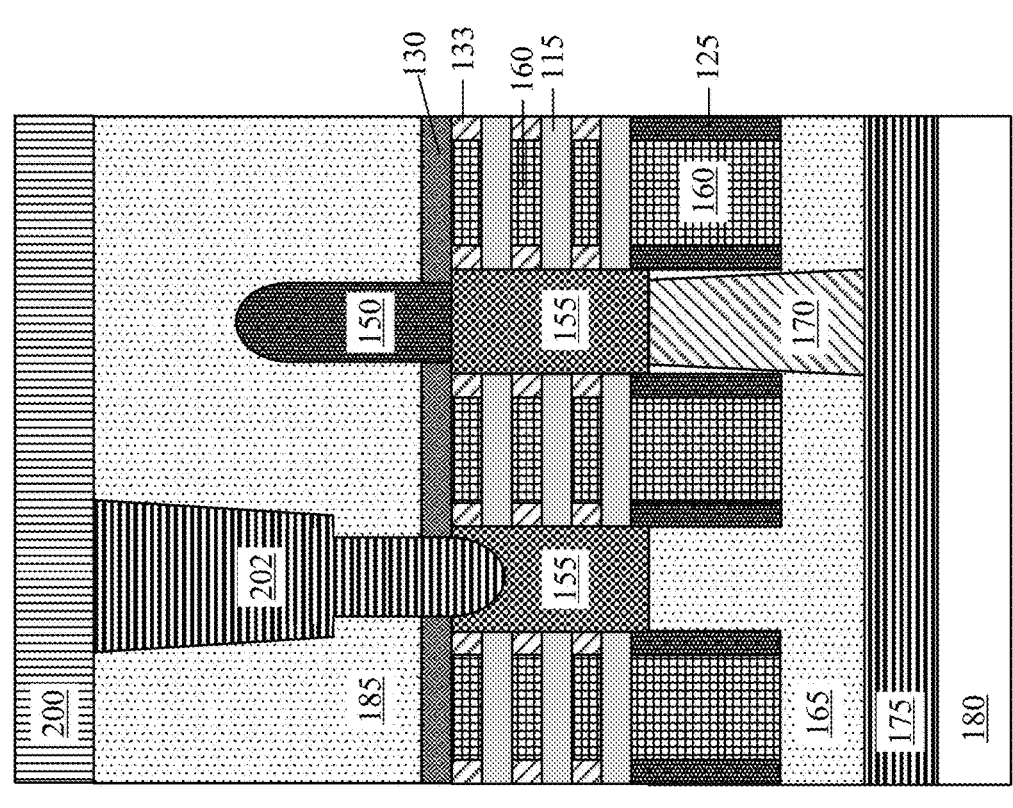
FIG. 18 illustrates a cross section X of the nanosheet transistor after formation of a second lithography layer and patterning/etching the shared backside contact, in accordance with the embodiment of the present invention.
Figure 19:
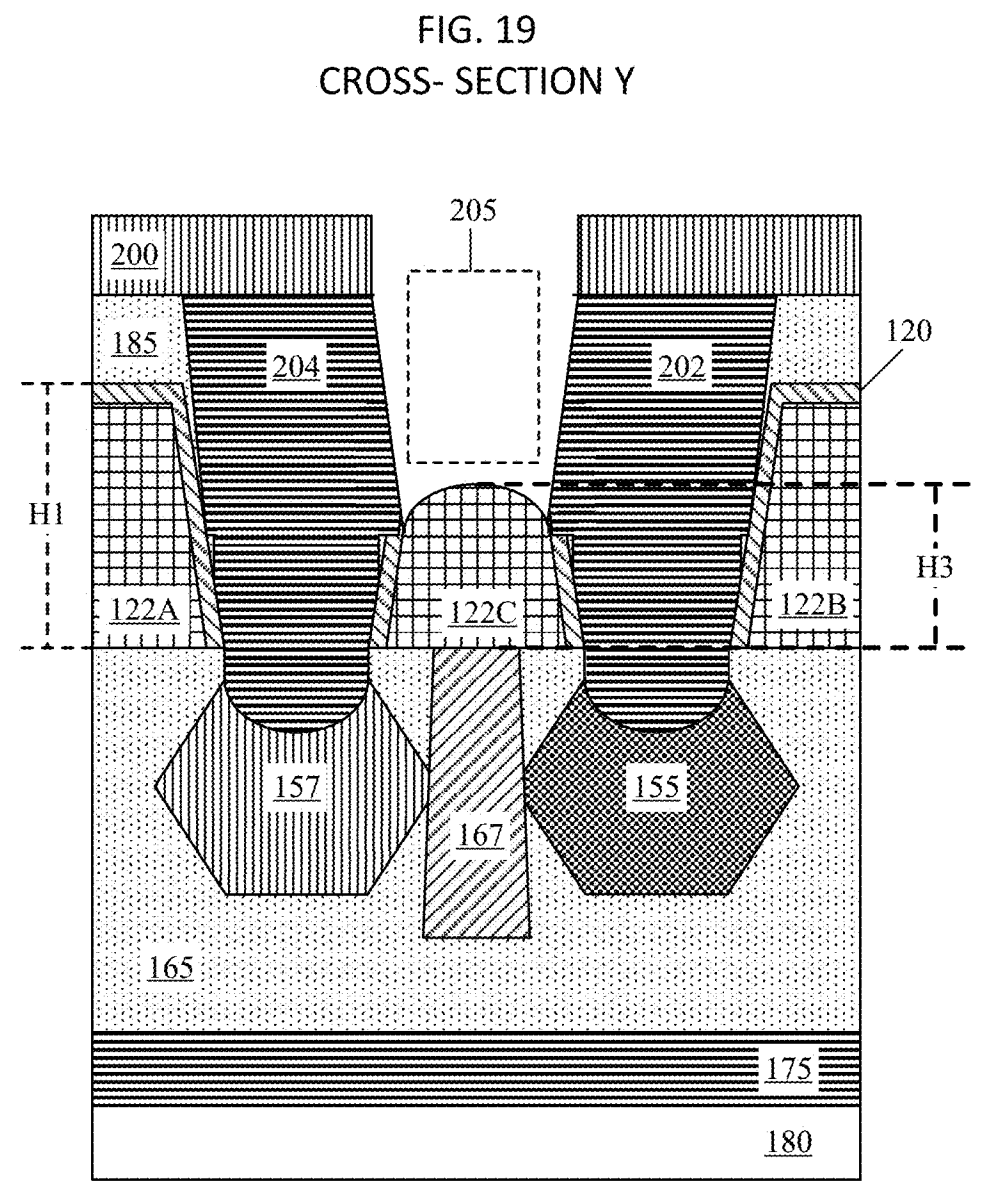

FIGS. 18 and 19 illustrate the processing stage after formation of a second lithography layer 200 and patterning/etching of the shared backside contact 195. A second lithography layer 200 is formed on the backside interlayer dielectric layer 185 and on top of the shared backside contact 195. The second lithography layer 200 and the shared backside contact 195 are patterned/etched to form a trench 205 within the backside shared contact 195. Trench 205 separates/divides the shared backside contact 195 into a first backside contact 202 and a second backside contact 204. Trench 205 extends downwards to expose the top surface of the center STI fill layer 122C. The etching of the shared backside contact 195 can further reduce the height of the STI fill layer 122C or the height could remain the same. The height H3 of the STI fill layer 122C can be equal to or less than the height H2 of the STI fill layer 122C.

Figure 20:
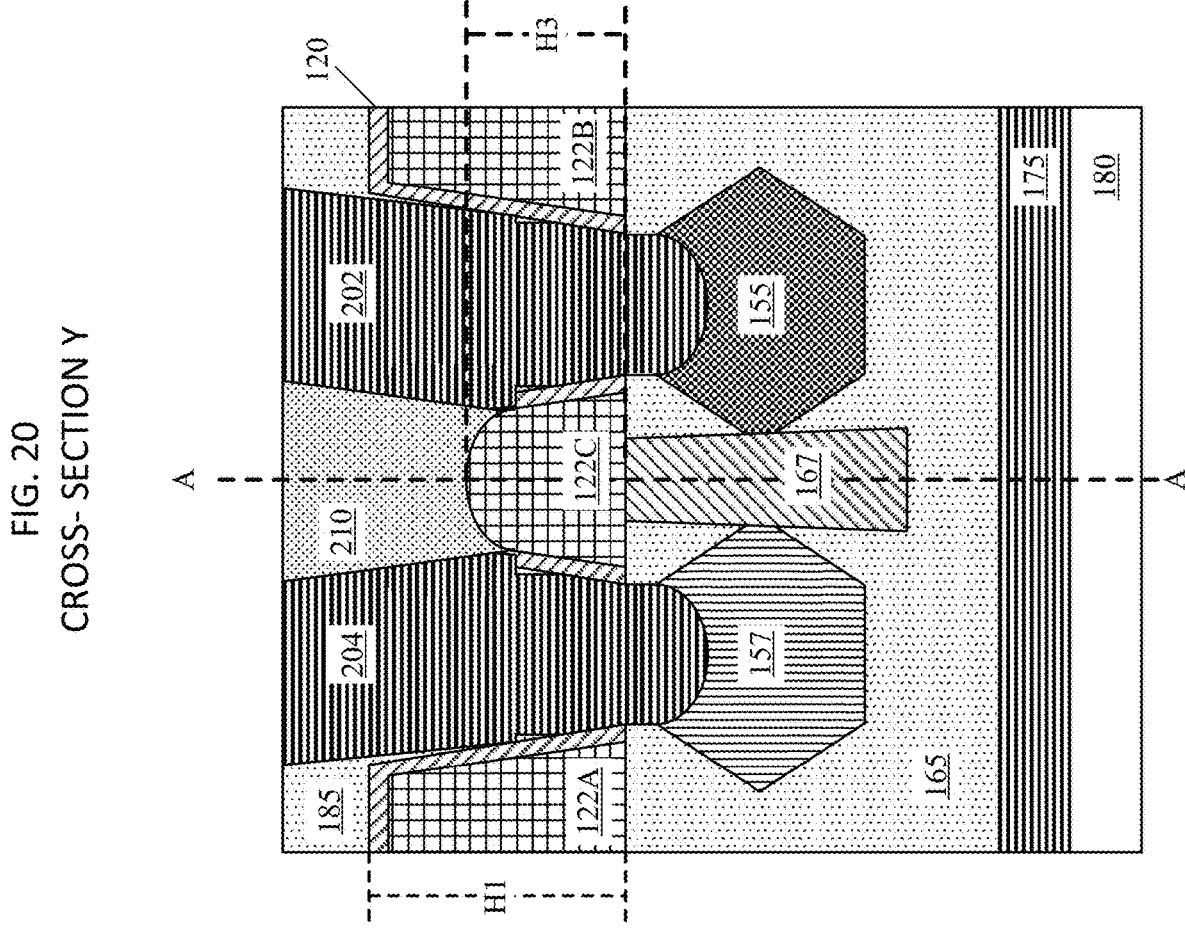
FIG. 20 illustrates a cross section Y of the source/drain region after formation of a backside isolation pillar, in accordance with the embodiment of the present invention.

FIG. 20 illustrates the processing stage after formation of a backside isolation pillar 210. Trench 205 is filled with an isolation material to form the backside isolation pillar 210. The bottom surface of the backside isolation pillar 210 is in direct contact with the STI fill layer 122C. The backside isolation pillar 210 is in vertical alignment with the frontside dielectric pillar 167 along vertical axis A. The backside isolation pillar 210 extends to the top of the backside contacts 202, 204.

Figure 21:
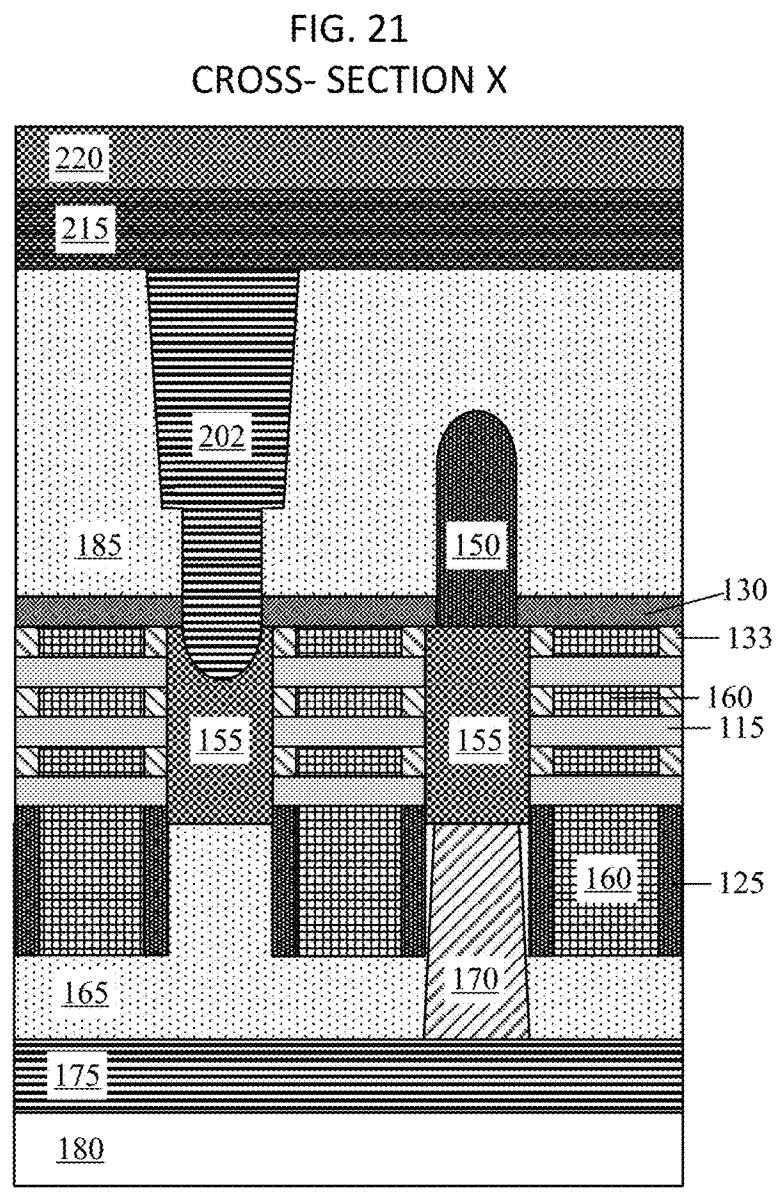
Figure 22:
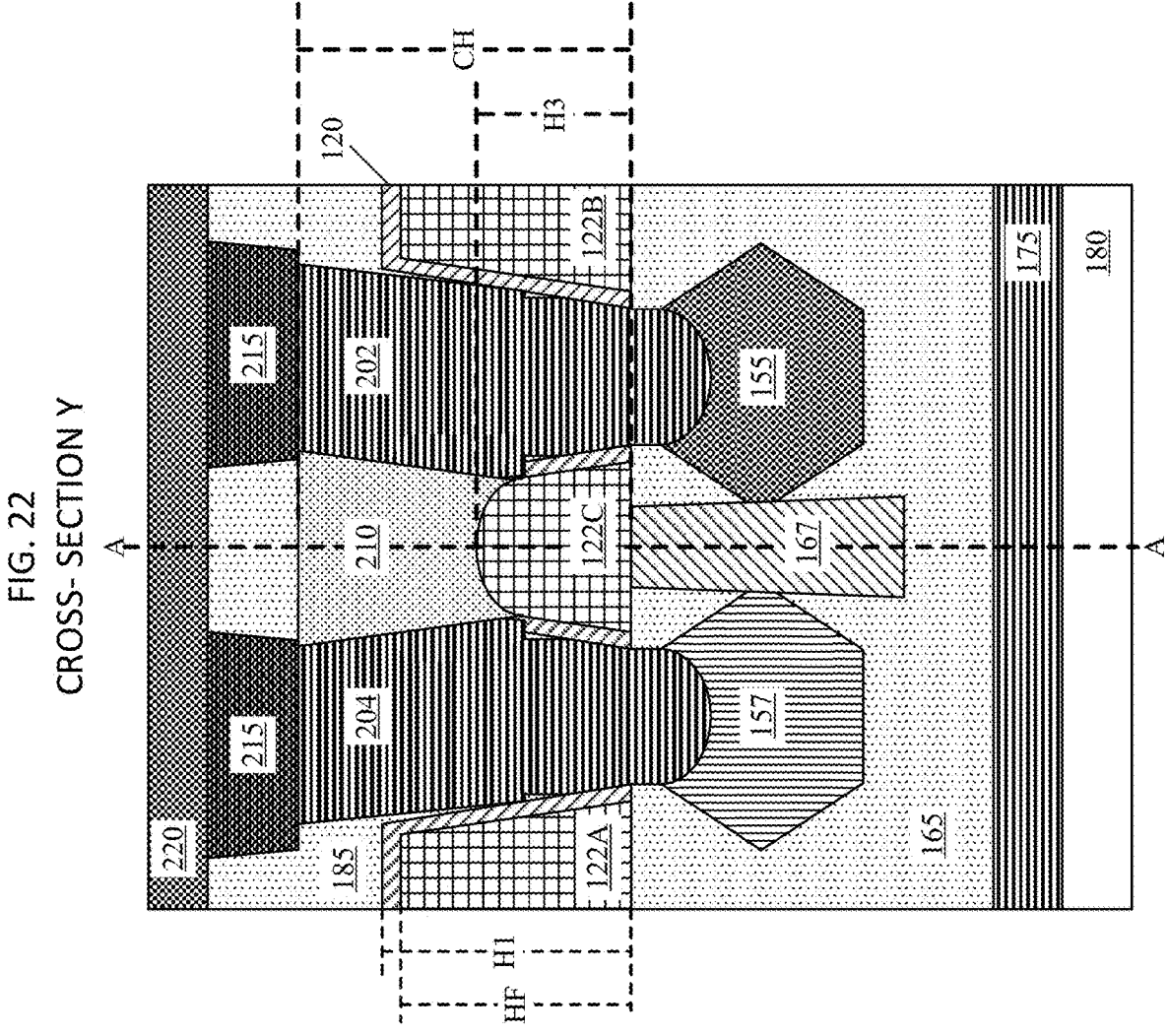
FIG. 22 illustrates a cross section Y of the source/drain region after increasing the height of the backside interlayer dielectric layer, formation of a plurality of metal lines and formation of a backside-power-distribution-network (BSPDN), in accordance with the embodiment of the present invention.

FIGS. 21 and 22 illustrate the processing stage after increasing the height of the backside interlayer dielectric layer 185, formation of a plurality of metal lines 215 and formation of a backside-power-distribution-network (BSPDN) 220. The height of the backside interlayer dielectric layer 185 is increased so that it extends on top of the backside isolation pillar 210 and on top of the first and second backside contacts 202, 204. The combined height CH of the center STI fill layer 122C and the backside isolation pillar 210 is greater than the height H1 of the shallow trench isolation layer (combined height of the STI liner 120 and the STI fill layer 122A or 122B). A plurality of trenches (not shown) are formed in backside interlayer dielectric layer 185. A plurality of metal lines 215 are formed by filling in the trenches with a conductive metal. Each of the plurality of metal lines 215 can be utilized as an VSS power rail, VDD power rail, or as signal line. A backside-power-distribution-network (BSPDN) 220 is formed on top of the plurality of metal lines 215 and the backside interlayer dielectric layer 185.

A microelectronic structure including a first nanosheet transistor that includes a first source/drain 155. A second nanosheet transistor that is adjacent to the first nanosheet transistor and the second nanosheet transistor includes a second source/drain 157. A first backside contact 202 connected to a backside surface of the first source/drain 155. A second backside contact 204 connected to a backside surface of the second source/drain 157. A first shallow trench fill layer 122C located between the first backside contact 202 and the second backside contact 204. A second shallow trench fill layer 122B located adjacent to the first backside contact 202. The second shallow trench fill layer 122B is located on the opposite side of the first backside contact 202 than the first shallow trench isolation layer 122C. A backside isolation pillar 210 located on top of the first shallow trench isolation fill layer 122C. A top surface of the backside isolation pillar 210 is coplanar with a top surface of the first and second backside contact 202, 204.

The first shallow trench fill layer 122C extends up a first height H3. The second shallow trench fill layer 122B extends up a second height HF. The first height H3 and the second height HF are different. The first height H3 is less than the second height HF. The first shallow trench fill layer 122C and the backside isolation pillar 210 have a first combined height CH. The first combined height CF is greater than the second height HF. A shallow trench isolation liner 120 located on top of the second shallow trench fill layer 122B. The shallow trench isolation liner 120 and the second shallow trench isolation fill layer 122B have a second combined height H1. The first combined height CH is greater than the second combined height H1.

A microelectronic structure including a first nanosheet transistor that includes a first source/drain 155. A second nanosheet transistor that is adjacent to the first nanosheet transistor and the second nanosheet transistor includes a second source/drain 157. A frontside isolation pillar 167 located between the first source/drain 155 and the second source/drain 157. A first backside contact 202 connected to a backside surface of the first source/drain 155. A second backside contact 204 connected to a backside surface of the second source/drain 157. A first shallow trench fill layer 122C located between the first backside contact 202 and the second backside contact 204. A second shallow trench fill layer 122B located adjacent to the first backside contact 202. The second shallow trench fill layer 122B is located on the opposite side of the first backside contact 202 than the first shallow trench isolation layer 122C. A backside isolation pillar 210 located on top of the first shallow trench isolation fill layer 122C. The backside isolation pillar 210 is vertically aligned with the frontside isolation pillar 167 along a common axis A.

The first shallow trench fill layer 122C extends up a first height H3. The second shallow trench fill layer 122B extends up a second height HF. The first height H3 and the second height HF are different. The first height H3 is less than the second height HF. The first shallow trench fill layer 122C and the backside isolation pillar 210 have a first combined height CH. The first combined height CF is greater than the second height HF. A shallow trench isolation liner 120 located on top of the second shallow trench fill layer 122B. The shallow trench isolation liner 120 and the second shallow trench isolation fill layer 122B have a second combined height H1. The first combined height CH is greater than the second combined height H1.

A method including the steps of forming a first nanosheet transistor that includes a first source/drain 155. Forming a second nanosheet transistor that is adjacent to the first nanosheet transistor and the second nanosheet transistor includes a second source/drain 157. Forming a first shallow trench fill layer 122C located between on in the backside region between the first source/drain 155 and the second source/drain 157. Forming a second shallow trench fill layer 122B located on in the backside region space apart from the first shallow trench fill layer 122C. Forming a shared backside a first backside contact 195 connected to a backside surface of the first source/drain 155 and a backside surface of the second source/drain 157. The formation of the shared backside contact 195 causes a height difference between the first shallow trench fill layer 122C and the second shallow trench fill layer 122B. Separating the shared backside contact 195 into a plurality of backside contacts 202, 204. Forming a backside isolation pillar 210 located on top of the first shallow trench isolation fill layer 122C. A top surface of the backside isolation pillar 210 is coplanar with a top surface of the first and second backside contact 202, 204.

The first shallow trench fill layer 122C extends up a first height H3. The second shallow trench fill layer 122B extends up a second height HF. The first height H3 is less than the second height HF. The first shallow trench fill layer 122C and the backside isolation pillar 210 have a combined height CF. The combined height CF is greater than the second height HF.

Forming a frontside isolation pillar 167 located between the first source/drain 155 and the second source/drain 157.

While the invention has been shown and described with reference to certain exemplary embodiments thereof, it will be understood by those skilled in the art that various changes in form and details may be made therein without departing from the spirit and scope of the present invention as defined by the appended claims and their equivalents.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the one or more embodiment, the practical application or technical improvement over technologies found in the marketplace, or to enable others of ordinary skill in the art to understand the embodiments disclosed herein.

What is claimed is:

1. A microelectronic structure comprising:
   a first nanosheet transistor that includes a first source/drain;
   a second nanosheet transistor that is adjacent to the first nanosheet transistor, wherein the second nanosheet transistor includes a second source/drain;
   a first backside contact connected to a backside surface of the first source/drain;
   a second backside contact connected to a backside surface of the second source/drain;
   a first shallow trench fill layer located between the first backside contact and the second backside contact;
   a second shallow trench fill layer located adjacent to the first backside contact, wherein the second shallow trench fill layer is located on the opposite side of the first backside contact than the first shallow trench isolation layer; and
   a backside isolation pillar located on top of the first shallow trench isolation fill layer, wherein a top surface of the backside isolation pillar is coplanar with a top surface of the first and second backside contact.

2. The microelectronic structure of claim 1, wherein the first shallow trench fill layer extends up a first height.

3. The microelectronic structure of claim 2, wherein the second shallow trench fill layer extends up a second height.

4. The microelectronic structure of claim 3, wherein the first height and the second height are different.

5. The microelectronic structure of claim 4, wherein the first height is less than the second height.

6. The microelectronic structure of claim 5, wherein the first shallow trench fill layer and the backside isolation pillar have a first combined height.

7. The microelectronic structure of claim 6, wherein the first combined height is greater than the second height.

8. The microelectronic structure of claim 7, further comprising a shallow trench isolation liner located on top of the second shallow trench fill layer.

9. The microelectronic structure of claim 8, wherein the shallow trench isolation liner and the second shallow trench isolation fill layer have a second combined height, wherein the first combined height is greater than the second combined height.

10. A microelectronic structure comprising:
   a first nanosheet transistor that includes a first source/drain;
   a second nanosheet transistor that is adjacent to the first nanosheet transistor, wherein the second nanosheet transistor includes a second source/drain;
   a frontside isolation pillar located between the first source/drain and the second source/drain;
   a first backside contact connected to a backside surface of the first source/drain;
   a second backside contact connected to a backside surface of the second source/drain;

a first shallow trench fill layer located between the first backside contact and the second backside contact;

a second shallow trench fill layer located adjacent to the first source/drain, wherein second shallow trench fill layer is located on the opposite side of the first backside contact than the first shallow trench isolation layer; and a backside isolation pillar located on top of the first shallow trench isolation fill layer, wherein the backside isolation pillar is vertically aligned with the frontside isolation pillar along a common axis.

11. The microelectronic structure of claim 10, wherein the first shallow trench fill layer extends up a first height.

12. The microelectronic structure of claim 11, wherein the second shallow trench fill layer extends up a second height.

13. The microelectronic structure of claim 12, wherein the first height and the second height are different.

14. The microelectronic structure of claim 13, wherein the first height is less than the second height.

15. The microelectronic structure of claim 14, wherein the first shallow trench fill layer and the backside isolation pillar have a first combined height.

16. The microelectronic structure of claim 15, wherein the first combined height is greater than the second height.

17. The microelectronic structure of claim 16, further comprising a shallow trench isolation liner located on top of the second shallow trench fill layer.

18. The microelectronic structure of claim 9, wherein the shallow trench isolation liner and the second shallow trench isolation fill layer have a second combined height, wherein the first combined height is greater than the second combined height.

19. A method comprising:

forming a first nanosheet transistor that includes a first source/drain;

forming a second nanosheet transistor that is adjacent to the first nanosheet transistor, wherein the second nanosheet transistor includes a second source/drain;

forming a first shallow trench fill layer located between on in the backside region between the first source/drain and the second source/drain;

forming a second shallow trench fill layer located on in the backside region space apart from the first shallow trench fill layer;

forming a shared backside a first backside contact connected to a backside surface of the first source/drain and a backside surface of the second source/drain, wherein the formation of the shared backside contact causes a height difference between the first shallow trench fill layer and the second shallow trench fill layer;

separating the shared backside contact into a plurality of backside contacts; and forming a backside isolation pillar located on top of the first shallow trench isolation fill layer, wherein a top surface of the backside isolation pillar is coplanar with a top surface of the first and second backside contact.

20. The method of claim 19, wherein the first shallow trench fill layer extends up a first height.

21. The method of claim 20, further comprising:

forming a frontside isolation pillar located between the first source/drain and the second source/drain.

22. The method of claim 19, wherein the second shallow trench fill layer extends up a second height.

23. The method of claim 22, wherein the first height is less than the second height.

24. The method of claim 23, wherein the first shallow trench fill layer and the backside isolation pillar have a combined height.

25. The method of claim 24, wherein the combined height is greater than the second height.

\* \* \* \* \*